United States Patent
Nakata et al.

(10) Patent No.: US 9,159,821 B2
(45) Date of Patent: Oct. 13, 2015

(54) NITRIDE SEMICONDUCTOR DEVICE WITH LIMITED INSTANTANEOUS CURRENT REDUCTION

(71) Applicant: SUMITOMO ELECTRIC INDUSTRIES, LTD., Osaka-shi, Osaka (JP)

(72) Inventors: Ken Nakata, Yokohama (JP); Keiichi Yui, Yokohama (JP); Hiroyuki Ichikawa, Yokohama (JP); Tsuyoshi Kouchi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/142,440

(22) Filed: Dec. 27, 2013

(65) Prior Publication Data

US 2014/0183563 A1 Jul. 3, 2014

(30) Foreign Application Priority Data

Dec. 28, 2012 (JP) ................ P2012-288596

(51) Int. Cl.
*H01L 29/78* (2006.01)
*H01L 29/778* (2006.01)
*H01L 29/20* (2006.01)

(52) U.S. Cl.
CPC ........ *H01L 29/7783* (2013.01); *H01L 29/7786* (2013.01); *H01L 29/2003* (2013.01)

(58) Field of Classification Search
CPC ............ H01L 29/7783; H01L 29/7786; H01L 29/2003
USPC ............ 257/194, 192, 76, E29.246, E29.252, 257/77, E21.403, E21.407, E29.253, 257/E21.441, E29.249, 11; 438/172
See application file for complete search history.

(56) References Cited

U.S. PATENT DOCUMENTS

| | | | | |
|---|---|---|---|---|
| 7,601,441 | B2* | 10/2009 | Jenny et al. | 428/698 |
| 8,344,419 | B2* | 1/2013 | Kikkawa | 257/192 |
| 2006/0220039 | A1 | 10/2006 | Yokoyama et al. | |

FOREIGN PATENT DOCUMENTS

JP 2006-286741 10/2006

* cited by examiner

*Primary Examiner* — Roy Potter
*Assistant Examiner* — Paul Patton
(74) *Attorney, Agent, or Firm* — Smith, Gambrell & Russell LLP.

(57) ABSTRACT

A GaN device suppressing the instantaneous current reduction after the shut-off of a high frequency signal is disclosed. The GaN device provides, on a SiC substrate, an AlN layer, a GaN layer, and an AlGaN layer, The SiC substrate has an energy difference greater than 0.67 eV but less than 1.43 eV; the AlN layer has a thickness less than 50 nm; and the GaN layer has a thickness less than 1.5 μm.

15 Claims, 9 Drawing Sheets

NITRIDE SEMICONDUCTOR DEVICE WITH LIMITED INSTANTANEOUS CURRENT REDUCTION

BACKGROUND

1. Field of the Invention

The presents application relates to a semiconductor device, in particular, the present application relates to a nitride semiconductor device formed on a semi-insulating silicon carbide (SiC) substrate.

2. Background Arts

A nitride semiconductor device, for instance, a field effect transistor (FET) such as high electron mobility transistor (HEMT) has been installed in a base station of the mobile communication system as an elementary device 15 showing high power at higher frequencies. A Japanese Patent laid open No. 2006-286741A has disclosed a HEMT device stacking, on a semi-insulating SiC substrate, semiconductor layers of an aluminum nitride (AlN) buffer layer, a gallium nitride (GaN) channel layer, and aluminum-gallium nitride 20 (AlGaN) carrier supplying layer in this order.

The gradual decrease of the drain current under a constant bias condition, which is often called as the current collapsing, may be suppressed by adequately setting a thickness of AlN buffer layer. However, the current reduction in a short time after the shut-off of the input high frequency signal, which is often called as the instantaneous current reduction, has been left as a subject to be solved.

SUMMARY OF THE INVENTION

An aspect of the present application relates to a nitride semiconductor device, in particular, the application relates to a device having a GaN layer as a channel layer The device comprises, on a semi-insulating SiC substrate, a sequentially stacked of an aluminum nitride (AlN) layer with a thickness thereof less than 50 nm, a gallium nitride (GaN) layer with a thickness of 1.5 μm layer; and a semiconductor layer, which supplies carriers to the GaN layer to induce a two-dimensional electron gas (2DEG) at the interface of the GaN layer against the layer, having energy bandgap greater than that of the GaN layer provided beneath the layer, where the layer on the GaN layer is preferably one of an aluminum-gallium nitride (AlGaN), indium aluminum nitride (InAlN) and indium aluminum gallium nitride (InAlGaN). A feature of the device of the present application is that the SiC substrate has the n-type conduction and energy difference greater than 0.67 eV but less than 1.43 eV, where the energy difference is measured from the bottom of the conduction band $E_C$ to the Fermi energy level $E_F$; or, the SiC substrate has the n-type conduction and the resistivity in a range from from $1 \times 10^8$ Ω·cm to $1 \times 10^{22}$ Ω·cm.

Moreover, the AlN layer and the GaN layer are preferably undoped layer, or at least GaN layer is free from transitions metals and acceptor dopants. Also, the SiC substrate contains donor dopants and acceptor dopants but the donor dopants, which may be selected from a group of nitrogen (N) phosphorus (P), and arsenic (As), has density larger than density of the acceptor dopants, which may be selected from a group of boron (B), aluminum (Al), and gallium (Ga).

The device thus configured shows an excellent behavior of the instantaneous reduction of the drain current after the shut-off of the input signal with high frequency components and a large power,

BRIEF DESCRIPTION OF THE DRAWINGS

The foregoing and other purposes, aspects and advantages will be better understood from the following detailed description of a preferred embodiment of the invention with reference to the drawings, in which:

FIG. 3A is the conduction band diagram of the device when a SiC substrate has large energy difference $\Delta E = E_F - E_F$; while.

DESCRIPTION OF EMBODIMENTS

First, experiments carried out by inventors will be described. A HEMT with a configuration of sequentially stacking, on a SiC substrate, an AlN layer by a thickness of 20 nm, a GaN layer by a thickness of 1.0 μm, and an AlGaN layer by a thickness of 25 nm in this order was formed. Then, electrodes of gate, source, and drain were formed on the AlGaN layer. Then, behaviors of the drain current after the shut-off of an input signal with high frequencies and substantial power were investigated.

Figure 1A:
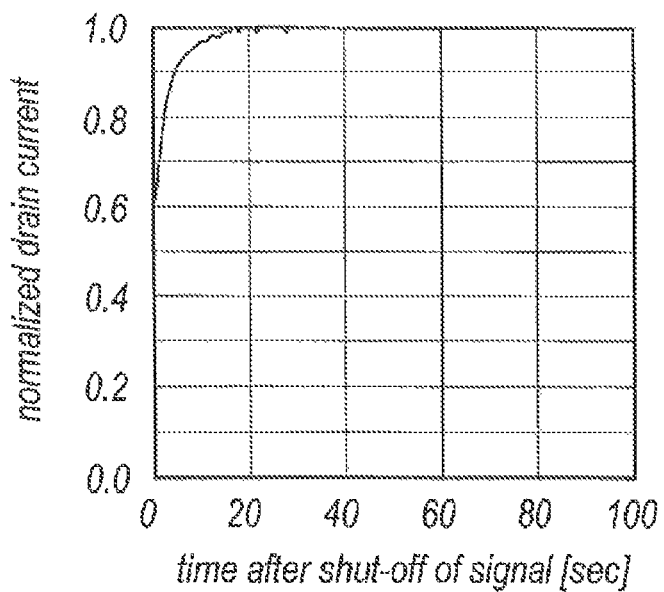
FIG. 1A shows in the linear scale a behavior of the drain current after the shutoff of the high frequency signal.
Figure 1B:
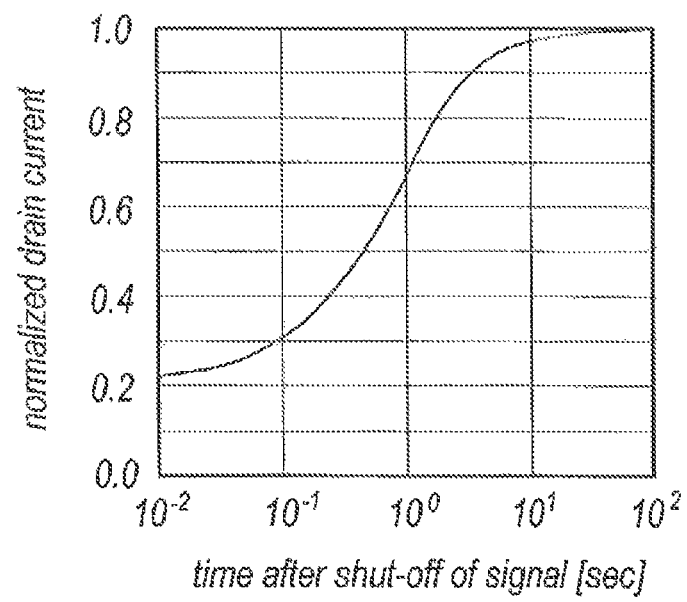
FIG. 1B shows the behavior shown in FIG. 1A by the logarithmic scale.

FIG. 1A shows the behavior of the drain current by a linear time scale, specifically, the reduction of the drain current was measured by a period of one (1) second, while, FIG. 1B shows the behavior of the drain current by the logarithmic scale to emphasize portions in short periods after the shut-off of the high frequency signal. Horizontal axes in FIGS. 1A and 1B correspond to the passing time after the shut-off; while, vertical axes show the behaviors of the drain current, which is normalized by the drain current flowing before the shut-off of the high frequency signal. In FIGS. 1A and 1B, the drain bias was set to be 50V. Although FIG. 1A shows that the the drain current is seemed to be reduced to around 0.6; FIG. 1B in a fine scale reveals the drain current reduces to around 0.2. Such a reduction appearing even in a short period induces degradation of high frequency performance of the HEMT, which results in failures in the communication system.

Figure 2:
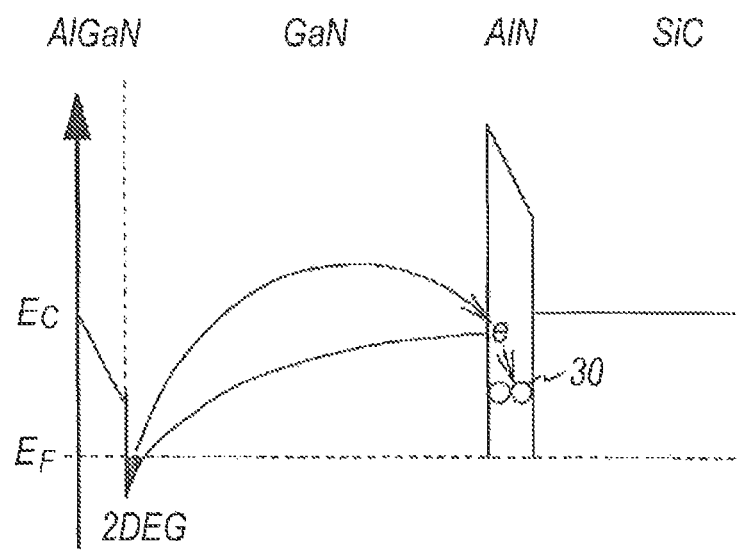
FIG. 2 is the conduction band diagram of the device that stacks an AlN layer, a GaN layer, and an AlGaN layer in this order on a SiC substrate.

A mechanism of the instantaneous current reduction after the shut-off of the high frequency signal may be explained as follows. That is, as shown in FIG. 2 which schematically illustrates the energy diagram of the conduction band of the HEMT that stacks layers of, on the SiC substrate, an AlN layer, a GaN layer, and an AlGaN layer, where the AlN layer contains electron traps 30 that capture electrons in the two-dimensional electron gas (2DEG) formed in the GaN layer at the interface against the AlGaN layer. The electron traps 30 in the number, or the concentration thereof, depend on a thickness of the AlN layer. A thicker AlN layer contains more traps 30, which results in the greater instantaneous current reduction after the shut-off of the high frequency signal. In the experiments, the AlN layer with a thickness of 20 nm, which is relatively thinner, effectively suppressed the the current reduction in a longer time scale, for instance, in a period of one (1) second.

However, as shown in FIG. 1B, even the AlN layer with the thickness of 20 nm brought a large instantaneous reduction of the drain current in a shorter period of 0.01 to 0.1 second. Other electron traps localized between 2DEG and AlN layer seem to contribute such instantaneous reduction of the drain current. In particular, regions of the GaN layer close to the AlN layer are likely to induce dislocations due to the lattice mismatching between AlN and GaN, which may show a function of the electron trap. The electron traps induced in the GaN layer seem to cause the instantaneous current reduction in a shorter period shown in FIG. 2B.

Relaxation of the lattice mismatching between AlN and GaN, which may decrease the electron traps in GaN layer, could suppress the instantaneous reduction. However, two materials, AlN and GaN, each provide a specific lattice constant inherently different from others. Accordingly, dislocations due to the lattice mismatching are unable to be removed thoroughly even when a variety of growth conditions of the GaN layer was tried. Other techniques instead of the reduction of the dislocations were indicated by the inventors that existing electron traps were filled with electrons so as not to show the function to capture electrons, which equivalently suppresses the instantaneous reduction of the drain current. Next, some embodiments to suppress the instantaneous reduction of the drain current in a short period after the shutoff of the high frequency signal will be described.

(First Embodiment)

A mechanism to compensate the function of the electron trap will be first described for a HEMT configured with the semiconductor stack of, on a SiC substrate, an AlN layer, a GaN layer, and an AlGaN layer in this order. The SiC substrate has resistivity greater than $1 \times 10^8$ Ω·cm from a view point to reduce a power loss in high frequencies. A difference between the bottom of the conduction band ($E_C$) and the Fermi energy ($E_F$), $E_C - E_F = \Delta E$, varies depending on impurity concentrations in the SiC substrate, and the conduction type thereof also depends on the energy difference $\Delta E$. In particular, because the level $E_C$ is inherent for a semiconductor material, the energy difference $\Delta E$ solely depends on the Fermi energy $E_F$ which is influenced primarily by the type and the concentration of impurities contained in the semiconductor material. Moreover, semiconductor materials each having respective Fermi level $E_F$ are stacked, the Fermi level $E_F$ must coincide with others in a whole stack; accordingly, in such a semiconductor stack, conductions bands in respective materials are discontinuously distributed.

Figure 3A:
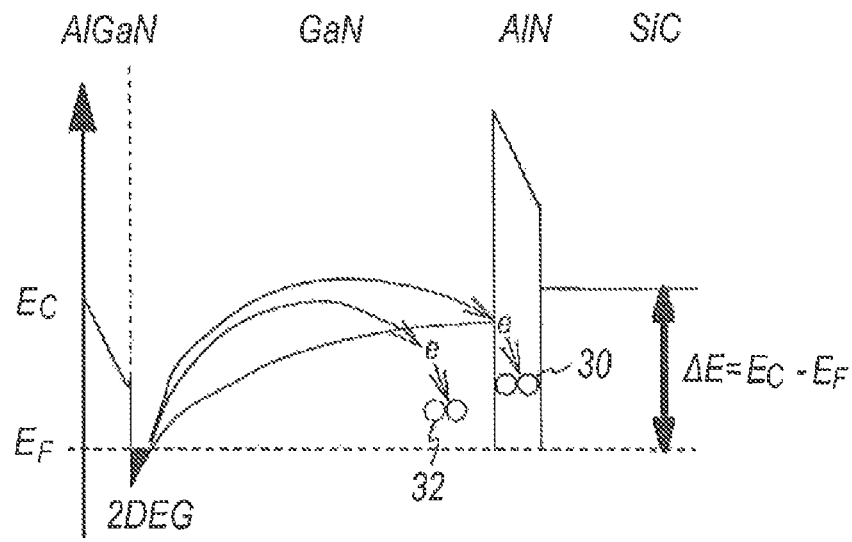
Figure 3B:
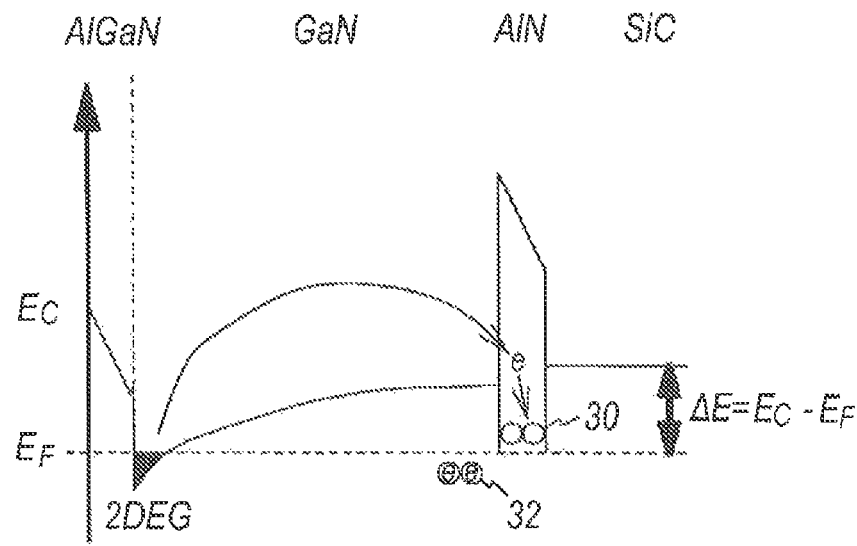
FIG. 3B is the band diagram of the device when a SiC substrate has relatively small energy difference $\Delta E$.

FIG. 3A shows a conduction band diagram when the energy difference $\Delta E$ of the SiC substrate is relatively large, while, another band diagram shown in FIG. 3B shows a state where the energy difference $\Delta E$ of the SiC substrate is smaller. In the former state shown in FIG. 3A, the energy difference $\Delta E$ of the AlN layer and that of the GaN layer close to the AlN layer also become larger; because the band discontinuity between SiC and AlN, and that between AlN and GaN are inherently determined by materials themselves when the materials are intrinsic without any intentional doping. Accordingly, larger energy difference $\Delta E$ in the SiC substrate affects the energy differences $\Delta E$ in the AlN layer and the GaN layer. Traps induced in the GaN layer closer to the AlN layer in the energy level thereof exceed the Fermi level $E_F$, which operates as the electron trap to capture electrons.

On the other hand, when the energy difference $\Delta E$ of the SiC substrate is small as shown in FIG. 3B, the energy difference $\Delta E$ of the AlN layer and that of the GaN layer closer to the AlN layer also become small influenced by the smaller energy difference $\Delta E$ of the SiC substrate. In such a state, electron traps 32 induced in regions of the GaN layer closer to the AlN layer in the energy level thereof exist lower than the Fermi level $E_F$ to be filled with electrons, which shows no function to trap electrons no longer.

Thus, even the AlN layer and the GaN layer have lattice conditions inherent to materials thereof, the energy difference $\Delta E$ may determine whether the electron traps caused in the GaN layer closer to the AlN layer become active or inactive. That is, the determination of the energy difference $\Delta E$ of the SiC substrate may control the instantaneous reduction of the drain current after the shut-off of the high frequency signal.

Figure 4:
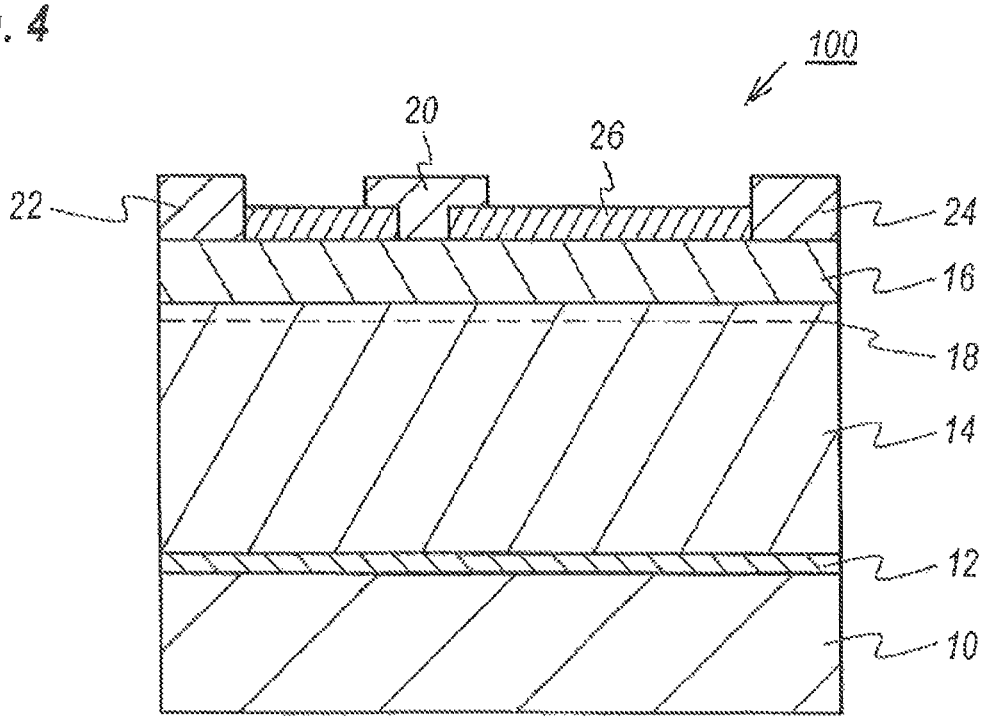
FIG. 4 shows a cross section of a GaN device according to a first embodiment.

FIG. 4 shows a cross section of a semiconductor device according to a first embodiment. As shown in FIG. 4, the semiconductor device 100 stacks, on SiC substrate 10, an AlN layer 12, a GaN layer 14, and a layer 16 to supply carriers into the GaN layer 14. The layer 16 has bandgap energy greater than bandgap energy of the GaN layer 14. The SiC substrate 10 has a hexagonal structure having symmetry groups of 4 H, 6 H and so on. The AlN layer 12 is in contact with (0001) Si surface of the SiC substrate 10. The GaN layer 14 is in contact with a top surface of the AlN layer 12. The electron supplying layer 16 is in contact with a top surface of the GaN layer 14, where 2DEG 18 is formed in the GaN layer 14 at the interface against the layer 16. Electrodes of gate 20, source 22 and drain 24, where the latter two electrodes, 22 and 24, put the gate 20 therebetween, are formed on the layer 16. The surface of the layer 16 is passivated with an SiN film 26 except for the electrodes, 20 to 24.

The SiC substrate 10 has a semi-insulating characteristic with the energy difference $\Delta E$ are greater than 0.67 eV but less than 1.43 eV. The AlN layer 12, which is often called as a buffer layer, has a thickness less than 50 nm. The GaN layer 14 is the channel layer and has a thickness less than 1.5 µm. The GaN layer 14 is preferable to be an intrinsic layer undoped with any transit ion metals, which will be described later. The electron supplying layer 16 has bandgap energy greater than that of GaN, and for instance, the layer 16 is typically made of AlGaN. The gate electrode 20 is made of multilayered metals including Ni and Au from the side of the SiC substrate 10, while, the source and drain electrodes, 22 and 24, are also made of multilayered metals stacking Ti and Al from the side of SiC substrate 10.

An effect to set the energy difference $\Delta E$ of the SiC substrate 10 between 0.67 eV and 1.43 eV will be described. Several devices each having the layer arrangement shown in FIG. 4 were prepared on various SiC substrates 10 each having a specific energy difference $\Delta E$ different from others; specifically, devices including an AlN layer with a thickness of 20 nm, an intrinsic GaN layer with a thickness of 1 µm; and an AlGaN layer with a thickness of 25 nm for the electron supplying layer 16 were formed on various types of the SiC substrates 10.

Figure 5:
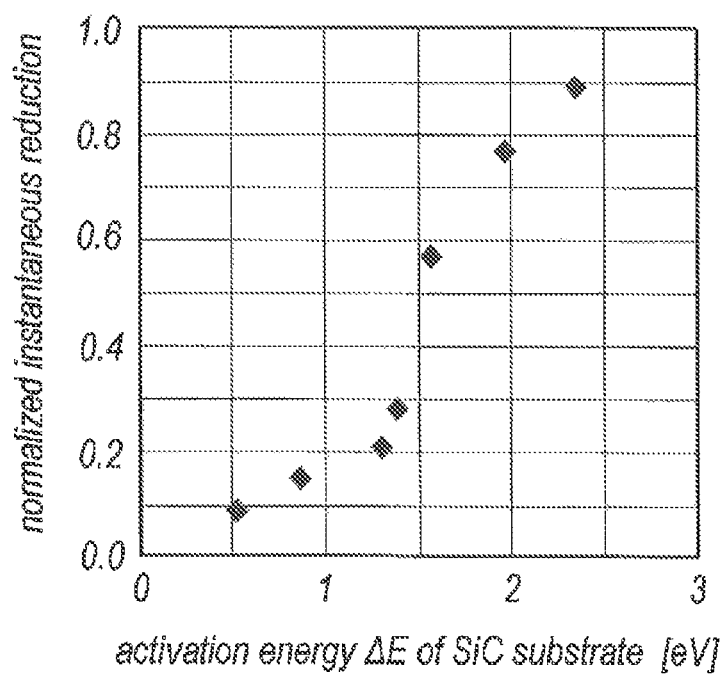
FIG. 5 shows a behavior of the instantaneous current reduction after the shut-off of the high frequency signal against the energy difference $\Delta E$ of the SiC substrate.

Devices thus formed were measured for the instantaneous reduction of the drain current after the shut-off of the high frequency signal by a time step of 0.01 second. FIG. 5 shows the instantaneous reduction of the drain current against various energy difference $\Delta E = E_C - E_F$ of SiC substrates. The vertical axis denotes the magnitude of the instantaneous reduction of the current $I_0 - I_1$ normalized by the current $I_0$, namely $(I^0 - I_1)/I_0$, where $I_0$ is the current when the high frequency signal is provided to the device, while, $I_1$ is the current measured at 0.01 second after the shut-off of the high frequency signal. In the measurement shown in FIG. 5, the devices were biased in the drain thereof with 50 V.

Figure 6:
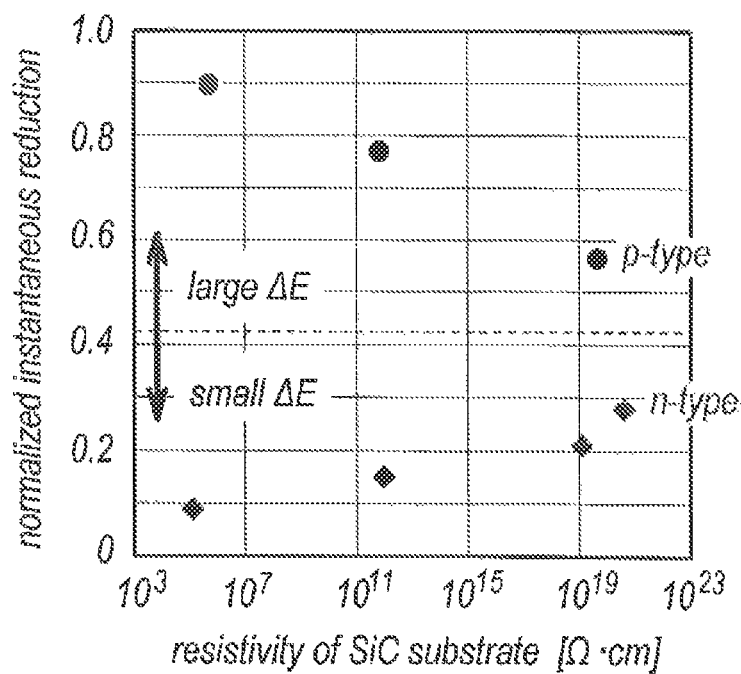
FIG. 6 shows behaviors of the instantaneous current reduction shown in FIG. 5 against the resistivity of the SiC substrate.

A large instantaneous reduction of the drain current is undesired from viewpoints of high frequency performances and the reliability. In an example, when the device (HEMT) of the first embodiment is used as a high-frequency amplifier, the instantaneous reduction of the drain current is preferably to be less than 0.5; but the instantaneous reduction less than 0.4 is further preferable. The energy difference $\Delta E$ of the SiC substrate 10 less than 1.43 eV gives the instantaneous reduction of the drain current less than 0.3. On the other hand, from a viewpoint of the signal loss in high frequencies by the device, the energy difference $\Delta E$ is necessary to be greater than 0.67 eV to secure the semi-insulating characteristic of the SiC substrate 10. Thus, the SiC substrate 10 reduces not only the loss in high frequencies but the instantaneous reduction after the shut-off of the high frequency signal by setting the energy difference $\Delta E$ greater than 0.67 eV but less than 1.43 eV, FIG. 6 describes the instantaneous current reduction against the resistivity of the SiC substrate 10. As already described, the energy difference $\Delta E$ strongly depends on the type and concentration of donors, acceptors, and transition metals contained in the SiC substrate 10. Also, the energy difference $\Delta E$ strongly influences the resistivity of the SiC substrate 10. When the energy difference $\Delta E_C$ of the SiC substrate 10 is small, the SiC substrate 10 tends to show the n-type conduction because the Fermi level $E_F$ approaches the conduction band. In particular, when the SiC substrate 10 has the resistivity less than $1 \times 10^{22}$ $\Omega$·cm at a room temperature, the instantaneous current reduction becomes less than 0.3. While, even when the resistivity of the SiC substrate 10 is less than $1 \times 10^{22}$ $\Omega$·cm, the normalized instantaneous reduction of the drain current is unable to be reduced when the energy difference $\Delta E$ of the SiC substrate 10 is large, where the SiC substrate 10 tends to show p-type conduction.

In another viewpoint, the resistivity of the SiC substrate 10 is preferably greater than $1 \times 10^8$ $\Omega$·cm to suppress the power loss of the device in high frequencies. Accordingly, the SiC substrate 10 is preferably doped with material or materials such that the SiC substrate 10 shows the n-type conduction and the resistivity thereof greater than $1 \times 10^8$ $\Omega$·cm but less than $1 \times 10^{22}$ $\Omega$·cm at a room temperature in order to compensate for the power loss in high frequencies and the instantaneous reduction of the drain current after the shut-off of the high frequency signal. The resistivity greater than $1 \times 10^8$ $\Omega$·cm but less than $\times 10^{22}$ $\Omega$·cm is equivalent to a state where the carrier concentration, namely, the electron concentration, in the SiC substrate 10 is less than $1 \times 10^{13}$ /cm$^3$.

Figure 7:
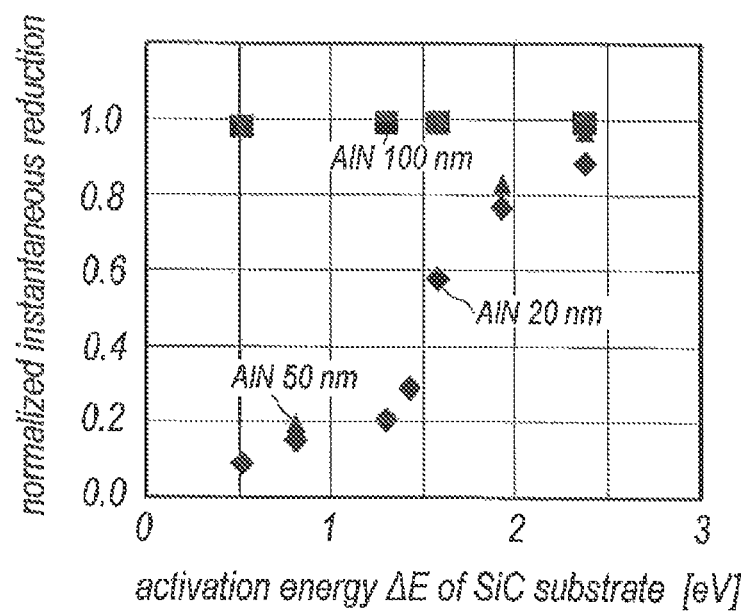
FIG. 7 adds behaviors of the instantaneous current reduction for an AlN layer having thicknesses of 50 nm and 100 nm to those shown in FIG. 5.

Next, a purpose to set the thickness of the AlN layer 12 to be less than 50 nm will be described. Another investigation similar to those done to get results shown in FIG. 5 was carried out but devices, where the thickness of the AlN layer 12 is 50 nm and 100 nm but the thickness of the GaN layer 14 provided on the AlN layer 12 was kept to be 1 μm, were prepared for investigating the instantaneous reduction of the current after the shut-off of the high frequency signal. FIG. 7 adds results of the present experiments, where the thickness of the AlN layer 12 is 50 and 100 nm, to those shown in FIG. 5, where the thickness is 20 nm. Filled squares in FIG. 7 correspond to results of AlN with a thickness of 100 nm, filled triangles show those with a thickness of 50 nm, while filled diamonds show those with a thickness of 20 nm. FIG. 7 explicitly indicates a relation between the Instantaneous reduction of the drain current against the thickness of the AlN layer 12.

Specifically, as shown in FIG. 7, the thicknesses, 20 nm and 50 nm, for the AlN layer 20 behave similar to each other and may suppress the instantaneous current reduction to a value less than 0.3 by setting the energy difference $\Delta E$ of the SiC substrate 10 to be smaller than 1.43 eV. While, the AlN layer with a thickness of 100 nm is hard to reduce the instantaneous current reduction even the energy difference $\Delta E$ is set less than 1.43 eV; rather, in a device with the AlN layer whose thickness is 100 nm, the drain current instantaneously disappears independent of the energy difference of the SiC substrate 10.

Figure 8:
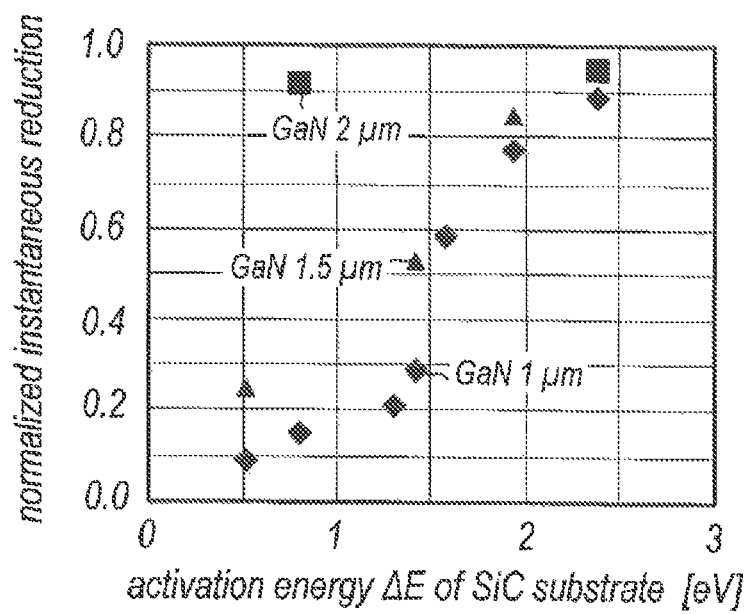
FIG. 8 adds behaviors of the instantaneous current reduction for a GaN layer having thickness of 2 μm and 1.5 μm to those shown in FIG. 5.

This is seemed to be due to a reason that a thicker AlN layer 12 inherently magnifies the energy difference $\Delta E$ in a region thereof closer to the GaN layer 14 by piezoelectric charges induced in AlN layer 12, which activates the electron traps contained in the GaN layer 14 closer to the AlN layer 12 independent of the existence of the SiC substrate 10. Accordingly, the AlN layer 12 with a thickness less than 50 nm may inactivate the electron traps induced in the GaN layer 14 closer to the AlN layer 12, which suppresses the instantaneous reduction of the drain current after the shut-off of the high frequency signal, Next, an object to set a thickness of the GaN layer 14 to be less than 1.5 μm will be described. Other investigations similar to those carried out to get results shown in FIG. 5 were performed by preparing devices in which the GaN layer 14 had thicknesses of 1.5 μm and 2.0 μm in addition to the device having a GaN layer with the thickness of 1.0 μm; while, all devices had the AlN layer 12 with the thickness of 20 nm. FIG. 8 adds results of thicknesses of 1.5 μm and 2.0 μm for the GaN layer 14 to those shown in FIG. 5. In FIG. 8, filled squares correspond to a case of 2.0 μm, filled triangles show a case of 1.5 μm; while, filled diamonds correspond to a case of 1.0 μm for thicknesses of the GaN layer 14. FIG. 8 explicitly shows a relation of the instantaneous current reduction against the thickness of the GaN layer 14.

When the GaN layer 14 has a thickness of 1.0 μm and 1.5 μm, the instantaneous current reduction is suppressed by setting the energy difference $\Delta E$ of the SiC substrate 10 to be less than 1.43 eV. On the other hand, the GaN layer 14 with a thickness of 2.0 μm is hard, or substantially impossible to reduce the instantaneous current reduction even the energy difference $\Delta E$ of the SiC substrate 10 is set less than 1.43 eV. Accordingly, the GaN layer 14 with a thickness less than 1.5 μm is preferable to reduce the instantaneous current reduction after the shut-off of the high frequency signal.

Thus, according to the first embodiment described above, a HEMT device 100 may effectively suppress the instantaneous current reduction after the shut-off the high frequency signal, a shown in FIGS. 5 to 8, when the SiC substrate 10 has the energy difference greater than 0.67 eV but less than 1.43 eV, the n-type conduction and the resistivity greater than $1 \times 10^8$ $\Omega$·cm but less than $1 \times 10^{22}$ $\Omega$·cm at a room temperature; an AlN layer 12 provided on a SiC substrate 10 having the thickness less than 50 nm; and a GaN layer 14 provided on the AlN layer 12 having the thickness less than 1.5 μm. The inventors first observed that the energy difference $\Delta E$ of the SiC substrate 10 may control whether the electron traps induced in a portion of the GaN layer 14 close to the AlN layer 12 become active or are left inactive, in particular, the energy difference $\Delta E$ greater than 0.67 eV but less than 1.43 eV effectively leaves the electron traps inactive. Moreover, the inventors first observed that the thickness of the AlN layer 12 and that of the GaN layer 14 also influence the instantaneous current reduction, in particular, the AlN layer 12 having the thickness less than 50 nm and the GaN layer 14 having the thickness less than 1.5 μm combined with the SiC substrate 10 with the energy difference of the desired range effectively suppress the instantaneous current reduction.

The Fermi level $E_F$ of the SiC substrate 10 depends on the type and the densities of the donor dopants and the acceptor dopants, and the balance of those dopants. The Fermi level $E_F$ is determined through the energy difference $\Delta E$ (=$E_C$−$E_F$), and the energy difference $\Delta E$ is calculated from the carrier concentration and the conduction type thereof. These parameters are estimated through a measurement of the Hall effect done at a high temperature, then, converting practically measured values into those at a room temperature based on the physical properties of those parameters and the semiconductor material. Selecting the type of the dopants and evaluating the energy difference $\Delta E$ thereof by the procedures above described; the type of the dopant, and/or the combination of dopants, and the density thereof may be decided such that the SiC substrate 10 has the energy difference $\Delta E$ in the range of 0.67 eV to 1.43 eV. From the practical experiment, the donor dopant may be selected from a group of nitrogen (N), phosphorus (P), and arsenic (As); while, the acceptor dopant may be selected from a group of boron (B), aluminum (Al), and gallium (Ga). The SiC substrate 10 of the present embodiment preferably has the n-type conduction with the resistivity thereof greater than $1 \times 10^8$ Ω·cm but less than $1 \times 10_{23}$ Ω·cm. The n-type conduction means that the SiC substrate 10 contains the donor dopant at least whose density is greater than the density of the acceptor dopant.

As already described, the AlN layer 12 with the thickness less than 50 nm effectively suppress the instantaneous current reduction after the shut-off of the high frequency signal. The AlN layer 12 is preferably thinner as possible. However, an AlN layer thinner than 5 nm causes a substantial leak current when the channel, namely 2DEG, is pinched off as disclosed in Japanese Patent Application laid open No. 2006-286741A. This leak current means, when the device is turned off, a current flows from the drain to the source. Thus, the AlN layer 12 is preferably thicker than 5 nm from the viewpoint of the leak current.

As for the GaN layer 14, the GaN layer 14 with a thickness thereof thinner than 1.5 μm effectively suppresses the instantaneous current reduction. However, an GaN layer 14 with a thickness thinner than 0.5 μm degrades the electron mobility thereof due to the stress caused by the lattice mismatching. Accordingly, the GaN layer 14 preferably has the thickness greater than 0.5 μm.

Figure 9:
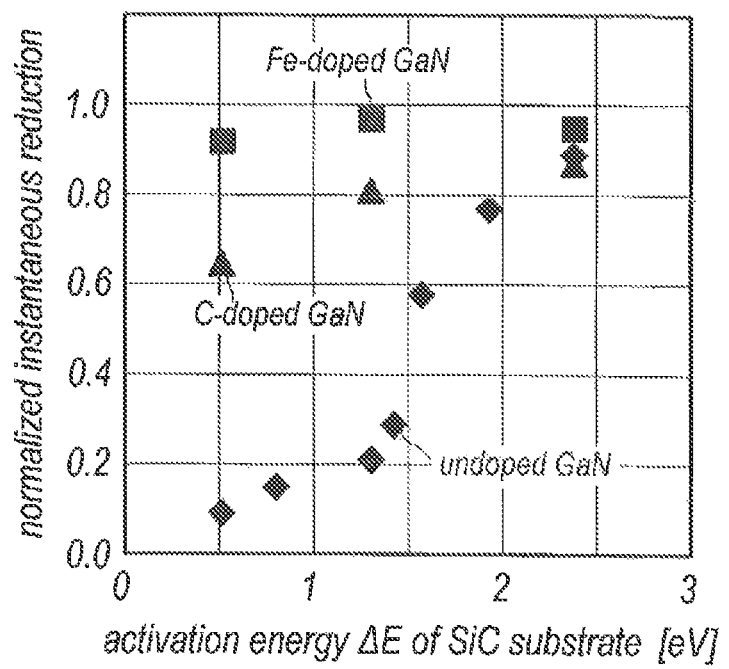
FIG. 9 adds behaviors of the instantaneous current reduction for a GaN layer doped with carbon (C) and iron (Fe) to those shown in FIG. 5.

Moreover, the GaN layer 14 is preferably undoped, or at least free from transition metals and acceptor dopants. Another experiment to investigate the doping conditions in the GaN layer 14 was carried out. Specifically, the instantaneous current reduction was measured in a similar manner to those of aforementioned experiments for devices including a GaN layer 14, which is doped with iron (Fe) or carbon (C) and has the thickness of 1 μm, formed on SiC substrates 10 having various energy difference $\Delta E$, where iron (Fe) is a transition metal, while, carbon (C behaves as an acceptor in SiC. FIG. 9 adds results of the present experiment to those shown in FIG. 5. In FIG. 9, filled squares show results for the GaN layer 14 doped with iron (Fe), filled triangles correspond to results for the GaN layer 14 doped with carbon (C) and filled diamonds correspond to an intrinsic GaN layer 14 where no impurities are intentionally doped.

As shown in FIG. 9, the intrinsic GaN layer 14 effectively suppresses the instantaneous current reduction by setting the energy difference $\Delta E$ of the SiC substrate 10 to be smaller than 1.43 eV. When the GaN layer 14 is doped with one of transition metals, namely iron (Fe), the instantaneous current reduction is left substantially independent of the energy difference $\Delta E$ of the SiC substrate 10. Thus, the GaN layer 14 is preferable free from the transition metals to suppress the instantaneous current reduction. When the GaN layer 14 is doped with one of acceptor dopants, namely carbon (C), the instantaneous current reduction is slightly suppressed by setting the energy difference of the SiC substrate 10 to be smaller than 1.43 eV but the degree of the suppression is limited. Thus, the GaN layer 14 is preferably free from the acceptor dopants to improve the instantaneous current reduction. Because the transition, metal and the acceptor dopant are seemed to show the function of the electron trap, the instantaneous current reduction after the shut-off of the high frequency signal is unable to be suppressed.

The intrinsic GaN layer 14, in particular, a GaN layer 14 free from the transition metal and the acceptor dopant, maybe obtained through a growing process by the MOCVD technique without using gas sources containing transition metals and acceptor dopants except for those for gallium (Ga) and nitrogen (N). Even when transition metals and acceptor dopants inherently contained in the source materials faintly are doped in the GaN layer 14, this should be distinguished from the intentional doping. For instance, when such impurities in the density thereof are less than $1 \times 10^{16}$ /cm$^3$, the GaN layer 14 should be called as the intrinsic layer, or free from such impurities because the impurities no longer behave as the electron trap when the density thereof becomes less than $1 \times 10^{17}$ /cm$^3$. Thus, the GaN layer 14 in the density of the transition metal and/or the acceptor dopant thereof is preferably less than $1 \times 10^{16}$ /cm$^3$. The transition metal may be, in addition to iron (Fe), titanium (Ti), vanadium (V), chromium (Cr), manganese (Nm), cobalt (Go), nickel (Ni), copper (Co), and so on; while, the acceptor dopant, in addition to carbon (C), magnesium (Mg), boron (B), and so on The embodiment thus described concentrates on the layer to supply carriers made of AlGaN. However, other materials may be used for the layer as long as the materials have the bandgap energy greater than that of GaN. For instance, the layer 16 may be made of InAlN, InAlGaN, and so on Also, the embodiment 100 thus described omits any cap layer to be provided on the layer 16; however, a cap layer made of, for instance, GaN may be additionally provided on the layer 16 to passivate the surface of the layer 16.

(Second Embodiment)

The second embodiment relates to a process to manufacture a semiconductor device whose layer configuration is similar to those shown in FIG. 4. The process first prepares a semi-insulating SiC substrate 10 that has the resistivity greater than $1 \times 10^9$ Ω·cm. Such a substrate 10 is available by balancing the density of donor impurities and that of acceptor impurities, where the former impurities are nitrogen (N), phosphorus (P) and/or arsenic (As); while, the latter impurities are boron (B), aluminum (Al) and/or gallium (Ga).

Then, the process grows, on SiC substrate 10, an AlN layer 12, a GaN layer 14, and a layer 16 sequentially by the MOCVD (Metal-Organized Chemical Vapor Deposition) technique. The growth conditions for respective layers are summarized in the table:

TABLE

Process conditions of GaN device

AlN layer 12

| Sources: | tri-methyl-aluminum (TMA), ammonia (NH$_3$) |
|---|---|
| Temperature: | 1100° C. |
| pressure: | 100 torr (1.33 × 10$^3$ Pa) |
| thickness: | 20 nm |

GaN layer 14

| sources: | tri-methyl-gallium (TMG), NH$_3$ |
|---|---|
| temperature: | 1080° C. |
| pressure: | 100 torr (1.33 × 10$^3$ Pa) |
| thickness: | 1 µm | layer 16

| sources: | TMA, TMG, NH$_3$ |
|---|---|
| temperature: | 1080° C. |
| pressure: | 100 torr (1.33 × 10$^3$ Pa) |
| thickness: | 25 nm |

The process subsequently deposits a silicon nitride (SiN) film 26 on the layer 16 by a thickness of 100 nm by using the plasma assisted chemical vapor deposition (p-CVD) technique. In an alternative, the process grows an n-type GaN cap layer on the layer 16 and the SiN film 26 covers thus formed n-GaN layer. The gate electrode 20 with the multilayered structure stacking nickel (Ni) and gold (Au) is subsequently formed on the layer 16 by the sequential process of the metal evaporation and the lift-off. Finally, source and drain electrodes, 22 and 24, are formed in respective sides of the gate electrode 20 by the process similar to those for the gate electrode 20. The source and drain electrodes, 22 and 24, also provide the stacked metal of titanium (Ti) and gold (Au), where Ti is in contact with the layer 16. The device thus processed has the gate length of 0.9 µm and a space between the gate and source electrodes is 1.5 µm, while a space between the gate and drain electrodes is 7 µm. That is, the device has, what is called, the offset gate.

The device showed the leak current of 3 µA/mm for a unit gate width at the pinch-off under the bias conditions of 50 V applied to the drain. The threshold voltage of the device was −0.5 V. The normalized instantaneous current reduction was 0.3, which was measured at 0.01 second passing after operating the device for one (1) minute at a saturated output power and shut-off of the input high frequency signal.

Another device comparable to the device above described was also investigated. The comparable device provides a SiC substrate showing the resistivity of 1×10$^9$ Ω·cm and the p-type conduction. Other configurations of the comparable device were the same as those of the above device. The leak current measured under the same conditions was 2 µA/mm and the normalized instantaneous current reduction was 0.9.

Even the device has a SiC substrate 10 with the resistivity greater than 1×10$^8$ Ω·cm but smaller than 1×10$^{22}$ Ω·cm, an AlN layer 12 with a thickness less than 50 nm, and a GaN layer with a thickness less than 1.5 µm, but, the conduction type of the SiC substrate 10 was the p-type as the comparable device described above the device is hard to suppress the instantaneous current reduction. On the other hand, when the SiC substrate 10 shows the n-type conduction, the instantaneous current reduction may be suppressed to be less than 0.3. The conduction type of the SiC substrate 10 may be directly determined by Hall measurement; or the temperature dependence of the resistivity may indirectly determine the conduction type, and the SIMS (Secondary ion Mass Spectroscopy) analysis may distinguish the impurity contained in the SiC substrate 10, which may determine the conduction type thereof.

While particular embodiments of the present application have been described herein for purposes of illustration, many modifications and changes will become apparent to those skilled in the art. Accordingly, the claims are intended to encompass all such modifications and changes as fall within, the true spirit and scope of this invention.

What is claimed is:

1. A nitride semiconductor device, comprising:
    a semi-insulating silicon carbide (SiC) substrate having energy difference between 0.67 eV and 1.43 eV, where the energy difference is an energy difference between a bottom of a conduction band and a Fermi energy of the SiC substrate;
    an aluminum nitride (AlN) layer provided on the SiC substrate, the AlN layer having a thickness less than 50 nm;
    a gallium nitride (GaN) layer provided on the AlN layer, the GaN layer having a thickness less than 1.5 µm; and
    a layer provided on the GaN layer, the layer having bandgap energy greater than bandgap energy of the GaN layer.

2. The device of claim 1,
    wherein the SiC substrate has an n-type conduction and resistivity greater than 1×10$^8$ Ω·cm but less than 1×10$^{22}$ Ω·cm.

3. The device of claim 1,
    wherein the AlN layer and the GaN layer are undoped layers.

4. The device of claim 1,
    wherein the GaN layer is substantially free from transitions metals.

5. The device of claim 1,
    wherein the GaN layer is substantially free from acceptor dopants.

6. The device of claim 1,
    wherein the SiC substrate contains donor dopants and acceptor dopants, the donor dopants having density greater than density of the acceptor dopants.

7. The device of claim 6,
    wherein the donor dopants are selected from a group of nitrogen (N), phosphorus (P), and arsenic (As) and the acceptor dopants are selected from a group of boron (B), aluminum (Al), and gallium (Ga).

8. The device of claim 1,
    wherein the layer is made of one of AlGaN, InAlN, and InAlGaN.

9. A nitride semiconductor device, comprising:
    a semi-insulating silicon carbide (SiC) substrate having an n-conduction type and resistivity in a range from 1×10$^8$ Ω·cm to 1×10$^{22}$ Ω·cm;
    an aluminum nitride (AlN) layer provided on the SiC substrate, the AlN layer having a thickness less than 50 nm;
    a gallium nitride (GaN) layer provided on the AlN layer, the GaN layer having a thickness less than 1.5 µm; and
    a layer provided on the GaN layer, the layer having bandgap energy greater than bandgap energy of the GaN layer.

10. The device of claim 9,
    wherein the AlN layer and the GaN layer are undoped layers.

11. The device of claim 9,
    wherein the GaN layer is substantially free from transitions metals.

12. The device of claim 9,
    wherein the GaN layer is substantially free from acceptor dopants.

13. The device of claim 9,
wherein the SiC substrate contains donor dopants and acceptor dopants, the donor dopants having density greater than density of the acceptor dopants.

14. The device of claim 13,
wherein the donor dopants are selected from a group of nitrogen (N), phosphorus (P), and arsenic (As), and the acceptor dopants are selected from a group of boron (B), aluminum (Al), and gallium (Ga).

15. The device of claim 9,
wherein the layer is made of one of AlGaN, InAlN, and InAlGaN.

* * * * *